US006943058B2

(12) United States Patent
Chaudhuri et al.

(10) Patent No.: US 6,943,058 B2
(45) Date of Patent: Sep. 13, 2005

(54) NO-FLOW UNDERFILL PROCESS AND MATERIAL THEREFOR

(75) Inventors: Arun K. Chaudhuri, Carmel, IN (US); Derek B. Workman, Noblesville, IN (US); Frank Stepniak, Noblesville, IN (US); Matthew R. Walsh, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 325 days.

(21) Appl. No.: 10/391,231

(22) Filed: Mar. 18, 2003

(65) Prior Publication Data

US 2004/0185602 A1 Sep. 23, 2004

(51) Int. Cl.[7] .............................................. H01L 21/44
(52) U.S. Cl. ...................... 438/108; 438/612; 438/613; 438/614; 438/615; 438/616; 438/660; 438/127; 438/124; 438/126; 257/787; 257/789; 257/795
(58) Field of Search ................................. 438/108, 612, 438/613, 614, 615, 616, 660, 124, 126, 127; 257/787, 789, 795

(56) References Cited

U.S. PATENT DOCUMENTS

| 5,904,791 | A |  | 5/1999 | Bearinger et al. | |
|---|---|---|---|---|---|
| 5,953,814 | A |  | 9/1999 | Sozansky et al. | |
| 6,307,749 | B1 |  | 10/2001 | Daanen et al. | |
| 6,434,817 | B1 |  | 8/2002 | Feigenbaum et al. | |
| 6,495,397 | B2 | * | 12/2002 | Kubota et al. ............... | 438/108 |
| 6,555,414 | B1 | * | 4/2003 | Vanfleteren et al. ........ | 438/108 |
| 6,599,775 | B2 | * | 7/2003 | Tie et al. ..................... | 438/108 |
| 6,692,611 | B2 | * | 2/2004 | Oxman et al. ............ | 156/275.5 |
| 6,770,510 | B1 | * | 8/2004 | Su ............................... | 438/108 |
| 6,815,258 | B2 | * | 11/2004 | Vincent ....................... | 438/118 |
| 2002/0066528 | A1 | * | 6/2002 | Oxman et al. ............ | 156/275.5 |
| 2002/0173075 | A1 | * | 11/2002 | Tie et al. ..................... | 438/108 |
| 2003/0131937 | A1 | * | 7/2003 | Konarski ..................... | 156/330 |
| 2003/0218261 | A1 | * | 11/2003 | Capote et al. ............... | 257/787 |
| 2004/0087057 | A1 | * | 5/2004 | Wang et al. ................. | 438/106 |
| 2004/0134604 | A1 | * | 7/2004 | Oxman et al. ............ | 156/275.5 |
| 2004/0185603 | A1 | * | 9/2004 | Jayaraman et al. ......... | 438/108 |

FOREIGN PATENT DOCUMENTS

| DE | 199 25 961 | 12/2000 |
|---|---|---|
| FR | 2812971 | 2/2002 |
| JP | 8199045 | 8/1996 |
| WO | 01/83607 | 11/1999 |
| WO | 01/55243 | 8/2001 |

OTHER PUBLICATIONS

European Search Report dated Jul. 20, 2004.
U.S. Appl. No. 09/949,556, filed Sep. 10, 2001, Chaudhuri, et al.

* cited by examiner

*Primary Examiner*—David Zarneke
*Assistant Examiner*—Victor V. Yevsikov
(74) *Attorney, Agent, or Firm*—Stefan V. Chmielewski

(57) ABSTRACT

A no-flow underfill material and process suitable for underfilling a bumped circuit component. The underfill material initially comprises a dielectric polymer material in which is dispersed a precursor capable of reacting to form an inorganic filler. The underfill process generally entails dispensing the underfill material over terminals on a substrate, and then placing the component on the substrate so that the underfill material is penetrated by the bumps on the component and the bumps contact the terminals on the substrate. The bumps are then reflowed to form solid electrical interconnects that are encapsulated by the resulting underfill layer. The precursor may be reacted to form the inorganic filler either during or after reflow.

20 Claims, 1 Drawing Sheet

NO-FLOW UNDERFILL PROCESS AND MATERIAL THEREFOR

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to underfill materials for flip chip devices. More particularly, this invention relates to a no-flow material for underfilling a flip chip device and an underfill method using the no-flow material.

(2) Description of the Related Art

Underfilling is well known for promoting the reliability of flip chip components, such as flip chips and ball grid array (BGA) packages that are physically and electrically connected to traces on organic or inorganic circuit boards with numerous solder bump connections. A basic function of an underfill material is to reduce the thermal expansion mismatch loading on the solder joints that electrically and physically attach a component, e.g., die, to an inorganic or organic substrate, such as a reinforced epoxy resin laminate circuit board. Underfill processes generally involve using a specially formulated dielectric material to completely fill the gap between the die and substrate and encapsulate the solder bump connections of the die. In conventional practice, underfilling takes place after the die is attached to the substrate. The underfill material is placed along the perimeter of the die, and capillary action is relied on to draw the material beneath the die.

Underfill materials preferably have a coefficient of thermal expansion (CTE) that is relatively close to that of the solder connections, die and substrate to minimize CTE mismatches that would otherwise reduce the thermal fatigue life of the solder connections. Dielectric materials having suitable flow and processing characteristics for capillary underfill processes are typically thermosetting polymers such as epoxies. To achieve an acceptable CTE, a fine particulate filler material such as silica is added to the underfill material to lower the CTE from that of the polymer to something that is more compatible with the CTE's of the die, circuit board, and the solder composition of the solder connections.

For optimum reliability, the composition of a filled underfill material and the underfill process parameters must be carefully controlled so that voids will not occur in the underfill material beneath the die, and to ensure that a uniform fillet is formed along the entire perimeter of the die. Both of these aspects are essential factors in terms of the thermal cycle fatigue resistance of the solder connections encapsulated by the underfill. While highly-filled capillary-flow underfill materials have been widely and successfully used in flip chip assembly processes, expensive process steps are typically required to repeatably produce void-free underfills. Capillary underfill materials require the use of expensive dispensing equipment, and the capillary underfill process is a batch-like process that disrupts an otherwise continuous flip chip assembly process. Also, the adhesive strength of a capillary underfill material critically depends on the cleanliness of the die after reflow, necessitating costly cleaning equipment and complex process monitoring protocols. As such, the benefits of flip chip assembly using capillary underfill materials must be weighed against the burden of the capillary underfill process itself. These considerations limit the versatility of the flip chip underfill process to the extent that capillary underfilling is not practical for many flip chip applications.

In view of the above, alternative underfill techniques have been developed. One such technique is to laminate a film of underfill material to a bumped wafer prior to die singulation and attachment. With this technique, referred to as wafer-applied underfill (WAU), the solder bumps on the wafer must be re-exposed, such as by burnishing or a laser ablation process. WAU has not been widely used because of the required burnishing step, which can yield inconsistent results, such as uneven underfill thickness. Another underfill technique involves the use of what has been termed a "no-flow" underfill material. In this technique, depicted in FIG. 1, an underfill material 120 is deposited on the surface of a substrate 116. A bumped die 110 is then placed on the substrate 116, and force is applied to the die 110 to cause solder bumps 112 on the die 110 to penetrate the underfill material 120 and register with terminals 118 (e.g., traces or bond pads) on the substrate 116. Finally, the solder bumps 112 are reflowed to secure the die 110 to the substrate 116, during which time the underfill material 120 cures.

Contrary to capillary-flow underfill materials, filler materials are not typically added to no-flow underfill materials because of the tendency for the filler material to hinder the flip chip assembly process. With reference again to FIG. 1, filler particles 124 present in the underfill material 120 can impede the penetration of the underfill material 120 by the solder bumps 112. Filler particles 124 can also become trapped between the solder bumps 112 and the terminals 118 to interfere with the formation of a metallurgical bond, resulting in reduced reliability of the electrical connection. Without a filler material to reduce their CTE, no-flow underfill materials have not been practical for use in harsh environments, such as automotive applications for flip chips on laminate circuit boards.

In view of the above, it would be desirable if an underfill material and process were available that were capable of achieving the product reliability obtainable with capillary-flow underfill materials and processes, but without the cost and processing limitations of these materials.

BRIEF SUMMARY OF THE INVENTION

The present invention provides a no-flow underfill material and process suitable for underfilling flip chips and other bumped components employed in harsh environments. The underfill material and process are adapted to incorporate a filler material in a manner that does not compromise component placement, solder connection and reliability, and therefore are suitable for use in underfill applications that have previously required capillary-flow underfill materials.

The no-flow underfill material of this invention is initially in the form of a dielectric polymer material in which a precursor is dispersed. According to a preferred aspect of the invention, the underfill material can initially be free of any particulate filler material, such as an inorganic filler typically used to reduce the CTE of a capillary-flow underfill material. However, the precursor added to the underfill material of this invention is chosen on the basis of being capable of reacting to form an inorganic filler that, as a result of having a CTE lower than the CTE of the polymer material, is able to reduce the CTE of the underfill material.

The underfill process of this invention generally entails forming the underfill material to comprise the polymer material containing the precursor, and then dispensing the underfill material over terminals on a substrate to which a bumped circuit component is to be mounted. The component is then placed on the substrate so that the underfill material is penetrated with bumps on the component and the bumps contact the terminals on the substrate. The bumps are then heated until molten (reflowed), followed by cooling so that the molten bumps form solid electrical interconnects that are metallurgically bonded to the terminals with electrical integrity. The underfill material forms an underfill layer that encapsulates the interconnects and contacts both the circuit component and the substrate. Either during heating of the bumps or a subsequent heat treatment, the precursor is reacted to form an inorganic filler having a CTE lower than the CTE of the polymer material.

According to a preferred aspect of the invention, the underfill layer is continuous, void-free, and completely fills the space defined by and between the component and the substrate. Because the underfill layer formed by the no-flow underfill material incorporates a filler material to reduce its CTE to something closer to that of the electrical (e.g., solder) connections it protects, the underfill material and process of this invention are capable of achieving the product reliability previously possible only with the use of highly-filled capillary-flow underfill materials and processes, but without the processing costs and limitations associated with capillary-flow underfill materials.

Other objects and advantages of this invention will be better appreciated from the following detailed description.

DETAILED DESCRIPTION OF THE INVENTION

Figure 1:
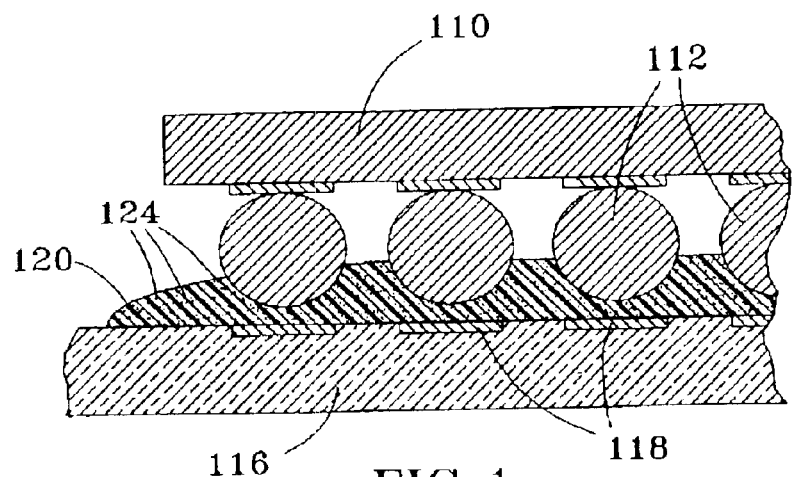
FIG. 1 represents a step in a no-flow underfill process in accordance with the prior art, by which a flip chip die is placed on a substrate so that solder bumps on the die penetrate a filled no-flow underfill material.
Figure 2:
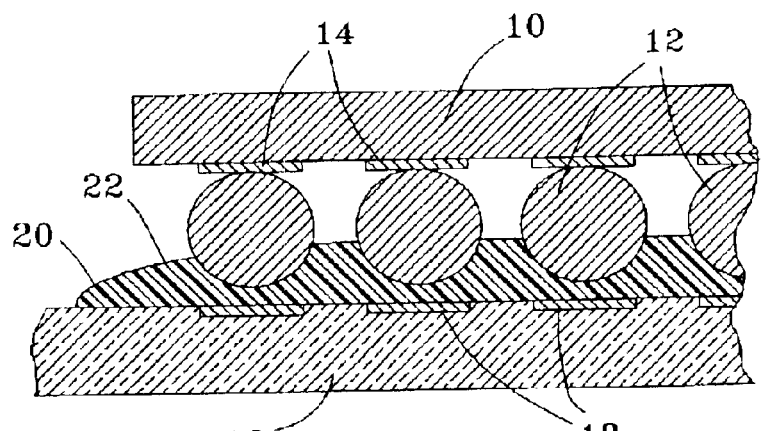
FIGS. 2 and 3 represent a sequence of steps in which an unfilled no-flow underfill material deposited on a substrate is penetrated by solder bumps on a flip chip die, and then a filler material is formed in situ within the underfill material during or following die attachment in accordance with the invention.
Figure 3:
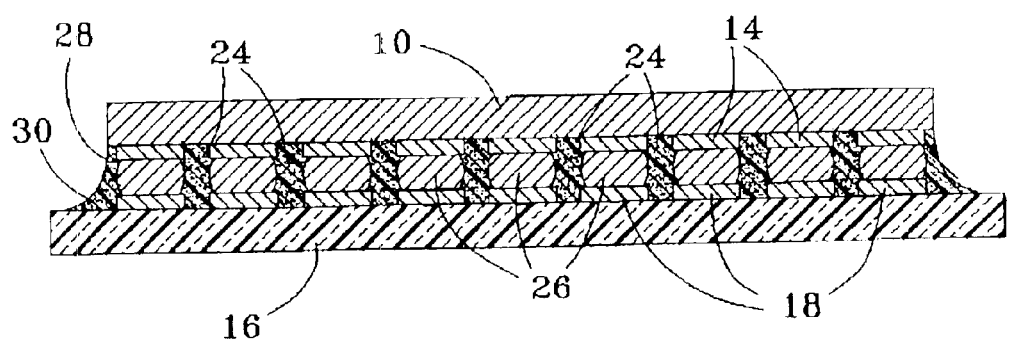

A no-flow underfill process in accordance with the present invention is schematically represented in FIGS. 2 and 3, by which a no-flow underfill material 20 is initially deposited in an unfilled condition (FIG. 2), but is formulated to form a particulate filler material 24 in situ (FIG. 3) following placement of a bumped circuit component 10. In FIG. 2, the underfill material 20 is shown as having been deposited on a substrate 16, which may be a circuit board formed of various materials, such as a thin organic laminate printed wiring board (PWB). As shown in FIG. 2, the circuit component, more specifically a flip chip die 10, is to be attached to the substrate 16 with solder bumps 12 formed on pads 14, such as under-bump metallurgy (UBM), defined on the die surface. The solder bumps 12 are intended to register with metal traces 18 (or other suitable terminals) on the substrate 16. While the underfill material 20 is represented as being deposited as a single layer, additional layers could be incorporated into the initial underfill structure.

The underfill material 20 is represented in FIG. 2 as not containing any filler material, more particularly, any inorganic filler particles capable of reducing the CTE of the underfill material 20 to something closer to those of the die 10, substrate 16 and solder bumps 12. As such, the underfill material 20 does not contain any filler particles of sufficient size and in a sufficient amount to significantly alter its CTE. Instead, the underfill material 20 is formulated to comprise a dielectric polymer material 22 containing a precursor capable of forming in situ the desired particulate filler material 24, which is shown in FIG. 3 as being dispersed in an underfill layer 28 formed as a result of curing or otherwise solidifying the underfill material 20.

The polymer material 22 is chosen to be compositionally and physically compatible with the materials it contacts, as well as have processing (e.g., cure) temperatures that are compatible with the die 10, the substrate 16, and the various components and circuit structures that might already be present on the substrate 16. Particularly suitable materials for the polymer material 22 are thermosetting polymers, such as epoxy adhesives. An example of a suitable epoxy adhesive material is commercially available from Loctite under the name FF2200. This material has a cure temperature of about 230° C. (compatible with the solder reflow profile) and a glass transition temperature of about 130° C. Other suitable polymer materials having different compositions and different cure and glass transition temperatures could be used, depending on the particular application. Furthermore, a flux compound can be added to the polymer material 22, such as in an amount of about 13 to about 25 weight percent, to crack, displace and/or reduce oxides on the solder bumps 12 and traces 18 that would otherwise interfere with the ability of these features to metallurgically bond to each other.

The precursor for the polymer material 22 is chosen in part on the basis of being able to form filler particles 24 having a CTE that is lower than that of the polymer material 22, with the effect of reducing the overall CTE of the underfill material 20 to something closer to the CTE's of the die 10, substrate 16, and solder bumps 12, for example, about 18 to 32 ppm/° C. Suitable precursors for use with this invention include organometallic compounds that can be thermally decomposed or otherwise reacted to form a metal oxide, an example of which is organometallic silicon (organosilicon) compounds capable of forming silica ($SiO_2$) when heated to temperatures and for durations that can be withstood by the die 10, solder bumps 12 and substrate 16. A particular organometallic silicon compound believed to be suitable for this purpose is tetraethylorthosilicate. When heated to a temperature of about 220° C. for about five minutes, this precursor thermally decomposes to form Si—O chains, whose condensation leads to the formation of silica nano-particles, i.e., particles whose major dimension is generally one hundred nanometers or less. When used in combination with an epoxy as the polymer material 22, thermal decomposition of the precursor can coincide with curing (polymerization) of the epoxy, which is believed to result in a structure having purely organic (epoxy) regions, glass-like inorganic (silica) regions, and mixed inorganic/organic regions.

The underfill material 20 must contain a sufficient amount of the precursor so that the resulting underfill layer 28 will contain enough filler particles 24 to appropriately adjust the CTE of the underfill layer 28. For example, the underfill layer 28 should contain about 60 weight percent, preferably about 55 to about 65 weight percent of the filler particles 24, depending on their composition. Adding the above-identified organometallic silicon compound in an amount of about 30 to about 40 weight percent of the underfill material 20 is believed to be sufficient to form silica nano-particles in an amount of about 55 to about 65 weight percent of the underfill layer 28.

As is apparent from FIG. 2, when assembling the die 10 with the substrate 16, the solder bumps 12 must penetrate the underfill material 20 to make contact with their respective traces 18. An important feature of this invention is that registration of the solder bumps 12 with their traces 18 is not hindered by the presence of filler particles in the underfill material 20, as evident from FIG. 2. During die placement, the underfill material 20 preferably forms a fillet 30 along the peripheral wall of the die 10, as depicted in FIG. 3. Once the underfill material 20 is penetrated and the solder bumps 12 contact their respective traces 18, the assembly can undergo a conventional reflow process to melt and coalesce the solder bumps 12, which upon cooling form solder connections 26 that are metallurgically bonded to their traces 18. During reflow, which is performed at a temperature of at least 183° C. and typically about 210° C. to about 225° C. if the solder bumps 12 are formed of the eutectic tin-lead solder, the polymer material 22 of the underfill material 20 may undergo curing if formed of the above-noted epoxy adhesive, but in any event the underfill material 20 surrounds the molten solder bumps 12 and contacts both the lower surface of the die 10 and the upper surface of the substrate 16. During reflow, the precursor may also undergo thermal decomposition to form the filler particles 24, creating a relatively uniform dispersion of the filler particles 24 throughout the underfill layer 28 that lowers the overall CTE of the layer 28 to something closer to the CTE of the solder connections 26. Upon cooling the assembly, the underfill layer 28 encapsulates the solder connections 26 and completely fills the space defined by and between the die 10 and substrate 16, thereby bonding the die 20 to the substrate 16. If curing of the polymer material 22 and/or thermal decomposition of the precursor was incomplete or did not occur during reflow, the assembly can undergo a thermal treatment to complete either or both of these reactions.

In view of the above, one can appreciate that the filled underfill layer 28 formed by the no-flow underfill material 20 and process of this invention can have a CTE that is sufficiently close to that of the solder connections 26 to improve the reliability of the flip chip assembly, while having a simplified manufacturing process and a reduced number of process steps as compared to capillary-flow underfill materials. As a result, the no-flow underfill material 20 and process of this invention enable CTE matching in a wider variety of flip chip applications than capillary-flow underfill materials and processes.

While the invention has been described in terms of a preferred embodiment, it is apparent that other forms could be adopted by one skilled in the art. Accordingly, the scope of the invention is to be limited only by the following claims.

What is claimed is:

1. A method of underfilling a bumped circuit component with a no-flow underfill material, the method comprising the steps of:
    forming the no-flow underfill material to comprise a dielectric polymer material containing a precursor, the underfill material being substantially free of an inorganic filler;
    dispensing the underfill material over terminals on a substrate;
    penetrating the underfill material with bumps on the circuit component so that the bumps contact the terminals;
    heating the bumps so that the bumps melt; and then
    cooling the molten bumps so that the molten bumps form solid electrical interconnects that are metallurgically bonded to the terminals, the underfill material forming an underfill layer that encapsulates the interconnects and contacts both the circuit component and the substrate;
    wherein the precursor is reacted to form an inorganic filler having a CTE lower than the CTE of the dielectric polymer material.

2. The method according to claim 1, wherein the precursor is an organometallic silicon compound and the inorganic filler comprises silica particles.

3. The method according to claim 2, wherein at least some of the silica particles are nano-particles.

4. The method according to claim 1, wherein the precursor is reacted to form the inorganic filler during the heating step.

5. The method according to claim 1, wherein the precursor is reacted to form the inorganic filler during a second heating step performed after the cooling step.

6. The method according to claim 5, wherein the dielectric polymer material is cured during the second heating step.

7. The method according to claim 1, wherein the dielectric polymer material is cured during the heating step.

8. A method of underfilling a flip chip die with a no-flow underfill material, the method comprising the steps of:
    forming the no-flow underfill material to comprise an uncured polymer adhesive material in which an organometallic silicon compound is dispersed, the underfill material being substantially free of an inorganic filler having a OTE lower than the CTE of the adhesive material;
    dispensing the underfill material over terminals on an organic laminate substrate;
    penetrating the underfill material with solder bumps on the circuit component so that the solder bumps contact the terminals and the underfill material completely fills a space defined by and between the die and the substrate;
    heating the solder bumps so that the solder bumps melt; and then
    cooling the molten solder bumps so that the molten solder bumps form solid solder connections that are metallurgically bonded to the terminals, the underfill material forming an underfill layer that encapsulates the solder connections and completely fills a space defined by and between the die and the substrate;
    wherein the organometallic silicon compound is thermally decomposed to form an inorganic filler comprising silica nano-particles.

9. The method according to claim 8, wherein the organometallic silicon compound is reacted to form the inorganic filler during the heating step.

10. The method according to claim 8, wherein the precursor is reacted to form the inorganic filler during a second heating step performed after the cooling step.

11. The method according to claim 8, wherein the adhesive material is cured during the second heating step.

12. The method according to claim 8, wherein the adhesive material is cured during the heating step.

13. A no-flow underfill material comprising a dielectric polymer material and a precursor, the underfill material being substantially free of an inorganic filler, the precursor being capable of reacting to form an inorganic filler having a CTE lower than the CTE of the dielectric polymer material.

14. The no-flow underfill material of claim 13, wherein the underfill material covers terminals on a substrate.

15. The no-flow underfill material of claim 14, wherein the underfill material is penetrated by bumps on a circuit component so that the bumps contact the terminals and the underfill material completely fills a space defined by and between the circuit component and the substrate.

16. The no-flow underfill material of claim 15, wherein the substrate is an organic laminate substrate.

17. The no-flow underfill material of claim 13, wherein the precursor is an organometallic silicon compound and, if the underfill material is sufficiently heated, the precursor reacts to form silica nano-particles dispersed within the underfill material.

18. The no-flow underfill material of claim 13, wherein the dielectric polymer material is an epoxy adhesive material.

19. A no-flow underfill layer between a flip chip die and an organic laminate substrate, the die being attached to the substrate with solder connections bonded to terminals on the substrate, the underfill layer comprising silica nano-particles dispersed in an adhesive material, the underfill layer encapsulating the solder connections and completely filling a space defined by and between the die and the substrate, wherein said silica nano-particles are formed from the reaction of a dielectric polymer material and a precursor mixture which is substantially free of an inorganic filler.

20. The no-flow underfill layer of claim 19 wherein, other than the silica nano-particles, the underfill layer is tree of an inorganic filler having a CTE lower than the CTE of the adhesive material.

* * * * *